United States Patent
Hsu et al.

(10) Patent No.: US 12,085,220 B2
(45) Date of Patent: *Sep. 10, 2024

(54) APPARATUS FOR STORING AND TRANSPORTING SEMICONDUCTOR ELEMENTS, AND METHOD OF MAKING THE SAME

(71) Applicant: Taiwan Semiconductor Manufacturing Co., Ltd., Hsin-Chu (TW)

(72) Inventors: Tse-Lun Hsu, Hsin-Chu (TW); Fang-Yu Liu, Hsinchu (TW); Tsez-Chong Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/231,763

(22) Filed: Aug. 8, 2023

(65) Prior Publication Data
US 2023/0383895 A1     Nov. 30, 2023

Related U.S. Application Data

(60) Continuation of application No. 16/922,387, filed on Jul. 7, 2020, now Pat. No. 11,796,123, which is a
(Continued)

(51) Int. Cl.
*F16M 11/08* (2006.01)
*B23P 19/04* (2006.01)
(Continued)

(52) U.S. Cl.
CPC .............. *F16M 11/08* (2013.01); *B23P 19/04* (2013.01); *G06K 7/10009* (2013.01);
(Continued)

(58) Field of Classification Search
CPC ..... F16M 11/08; B23P 19/04; G06K 7/10009; H01L 21/67373; H01L 21/37386; H04W 4/80; B65D 25/00; B65D 2585/86
See application file for complete search history.

(56) References Cited

U.S. PATENT DOCUMENTS

| 2,732,581 A | * | 1/1956 | Heck | .......................... E05D 5/10 |
| | | | | 16/257 |
| 4,344,646 A | * | 8/1982 | Michel | ................ E05B 65/5276 |
| | | | | 292/87 |

(Continued)

FOREIGN PATENT DOCUMENTS

| CN | 1418166 A | * | 5/2003 | ........... A47K 10/421 |
| GB | 2264105 A | * | 8/1993 | ........... B65D 43/164 |

(Continued)

OTHER PUBLICATIONS

Official Action issued Jan. 16, 2019, in corresponding Taiwan Patent Application No. 10820041630.

*Primary Examiner* — Bayan Salone
(74) *Attorney, Agent, or Firm* — Duane Morris LLP

(57) ABSTRACT

An apparatus includes a first portion and a second portion. The first portion includes a first front side wall, a first rear side wall, a top wall, and at least one pivotal pin structure extending from the first rear side wall. The at least one pivotal pin structure comprises a base, a shaft, and a head having a non-circular cross-sectional shape. The second portion includes a second front side wall, a second rear side wall, a bottom wall, and at least one pin holder extending from the second rear side wall. The at least one pin holder defines an opening for accepting the head of the at least one pivotal pin structure at an alignment. The head of the at least one pivotal pin structure extends through the opening. The
(Continued)

first portion and the second portion are pivotally movable between an open configuration and a closed container configuration.

20 Claims, 15 Drawing Sheets

Related U.S. Application Data division of application No. 15/713,772, filed on Sep. 25, 2017, now Pat. No. 10,738,935.

(51) Int. Cl.
    *G06K 7/10*     (2006.01)
    *H01L 21/67*     (2006.01)
    *H01L 21/673*     (2006.01)
    *H04W 4/80*     (2018.01)

(52) U.S. Cl.
    CPC ......... *H01L 21/67373* (2013.01); *H01L 21/67386* (2013.01); *H04W 4/80* (2018.02)

(56) References Cited

U.S. PATENT DOCUMENTS

| | | | |
|---|---|---|---|
| 4,546,874 A | 10/1985 | Kirchhan | |
| 4,574,944 A | 3/1986 | Gregory | |
| 4,746,008 A | 5/1988 | Heverly et al. | |
| 4,815,596 A | 3/1989 | Reid | |
| 5,024,329 A * | 6/1991 | Grohrock | H01L 21/67369 141/98 |
| 5,048,715 A | 9/1991 | Wolff | |
| 6,131,760 A * | 10/2000 | Huang | B65D 43/164 220/326 |
| 6,354,461 B1 | 3/2002 | Tenney et al. | |
| 6,523,690 B1 * | 2/2003 | Buck | B65D 83/0805 221/63 |
| 7,963,131 B2 | 6/2011 | Zhang et al. | |
| 10,738,935 B2 * | 8/2020 | Hsu | H01L 21/67386 |
| 11,881,421 B2 * | 1/2024 | Tsai | H01L 21/67356 |
| 2003/0062275 A1 * | 4/2003 | Rochelo | B65D 81/027 206/723 |

FOREIGN PATENT DOCUMENTS

| | | | |
|---|---|---|---|
| JP | H0640461 A | * | 2/1994 |
| TW | 201627213 A | | 8/2016 |

* cited by examiner

APPARATUS FOR STORING AND TRANSPORTING SEMICONDUCTOR ELEMENTS, AND METHOD OF MAKING THE SAME

PRIORITY CLAIM AND CROSS-REFERENCE

This application is a continuation of U.S. patent application Ser. No. 16/922,387, filed Jul. 7, 2020, which is a divisional application of U.S. patent applicaton Ser. No. 15/713,772, filed on Sep. 25, 2017, each of which is expressly incorporated by reference herein in their entireties.

BACKGROUND

In the fabrication processes for making semiconductor devices, semiconductor substrates such as wafers are processed under clean room conditions. Off-site analysis of samples of the semiconductor substrates or elements thereof before or after a certain manufacturing step are needed for different purposes, for example, for quality check. Such samples are generally packed in a container for storing, transporting and/or shipping. Containers whose interior offers a clean room climate are therefore necessary for storing the semiconductor wafers and for transporting the semiconductor wafers to the various processing locations. The containers should be optimally tight, and should not release any contaminating substances, for example, particles or gases. As the wafer size gets larger while the resulting devices are scaled to smaller sizes, new materials and containers are being considered for protecting sensitive semiconductor elements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. Like reference numerals denote like features throughout specification and drawings.

DETAILED DESCRIPTION

Figure 1A:
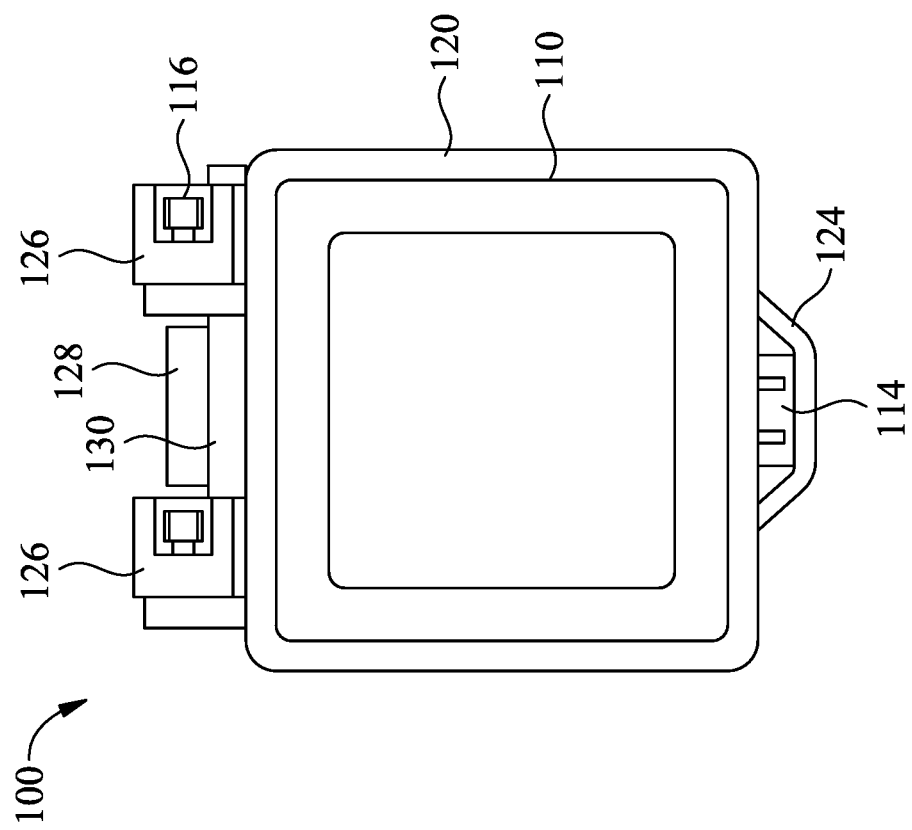
FIG. 1A is a top view illustrating an exemplary apparatus in a closed container configuration in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the folmation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure the singular forms "a," "an," and "the" include the plural reference, and reference to a particular numerical value includes at least that particular value, unless the context clearly indicates otherwise. Thus, for example, a reference to "a side wall" is a reference to one or more of such structures and equivalents thereof known to those skilled in the art, and so forth. When values are expressed as approximations, by use of the antecedent "about," it will be understood that the particular value forms another embodiment. As used herein, "about X" (where X is a numerical value) preferably refers to ±10% of the recited value, inclusive. For example, the phrase "about 8" preferably refers to a value of 7.2 to 8.8, inclusive; as another example, the phrase "about 8%" preferably (but not always) refers to a value of 7.2% to 8.8%, inclusive. Where present, all ranges are inclusive and combinable. For example, when a range of "1 to 5" is recited, the recited range should be construed as including ranges "1 to 4", "1 to 3", "1-2", "1-2 & 4-5", "1-3 & 5", "2-5", and the like. As discussed herein, the phrases "substantially the same" or "slightly larger" may refer to a dimension having variations within ±10% of the base dimension. It is intended that any component, element, attribute, or step that is positively recited herein may be explicitly excluded in the claims, whether such components, elements, attributes, or steps are listed as alternatives or whether they are recited in isolation.

The present disclosure provides an apparatus, and a method of making the same. The apparatus is used for storing and transporting semiconductor elements. References to "apparatus" made below will be understood to encompass a container, a delivery unit, an assembly, a system thereof, and the like. References to "semiconductor elements" made below will be understood to encompass any semiconductor based samples or products including but not limited to wafers, portions of wafers, and semiconductor devices.

Figure 5:
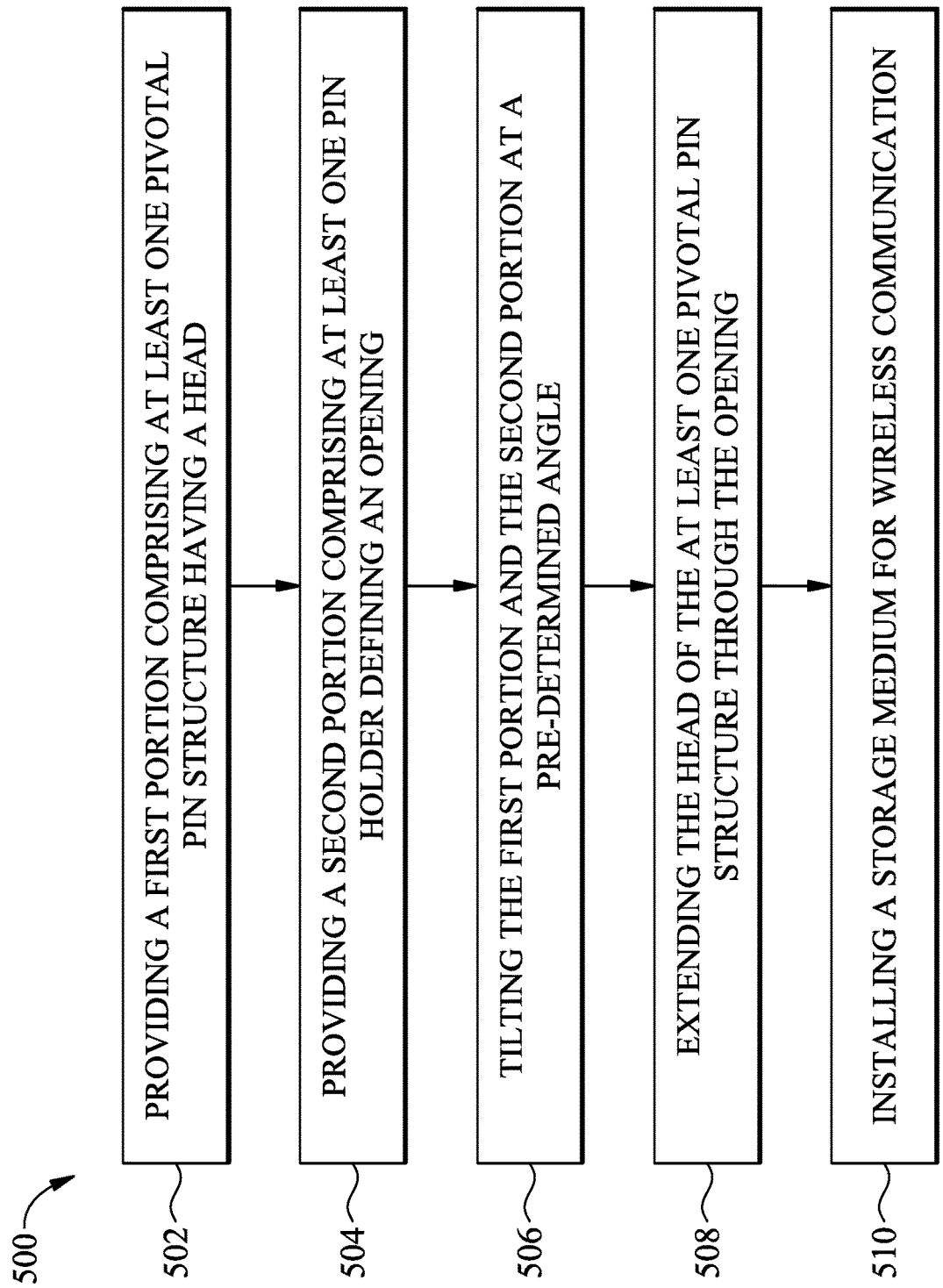
FIG. 5 is a flow chart illustrating an exemplary method for forming an apparatus in accordance with some embodiments.

In all the figures, like items are indicated by like reference numerals, and for brevity, descriptions of the structure, provided above with reference to the preceding figures, are not repeated. The method described in FIG. 5 are described with reference to the exemplary structures described in FIGS. 6 and 7A-7C, and the figures before FIG. 5.

Referring to FIGS. 1A to 1F, an exemplary apparatus 100 is illustrated. Exemplary apparatus 100 comprises two body portions including a first portion (or a first body portion) 110 and a second portion (or a second body portion) 120. The first portion 110 comprises a top wall 111, a first front side wall 112-1, a first rear side wall 112-2, and two additional side walls 112-3 and 112-4. The top wall 111 is integrally coupled with the first front side wall 112-1, the first rear side wall 112-2, and additional side walls 112-3 and 112-4.

Figure 1B:
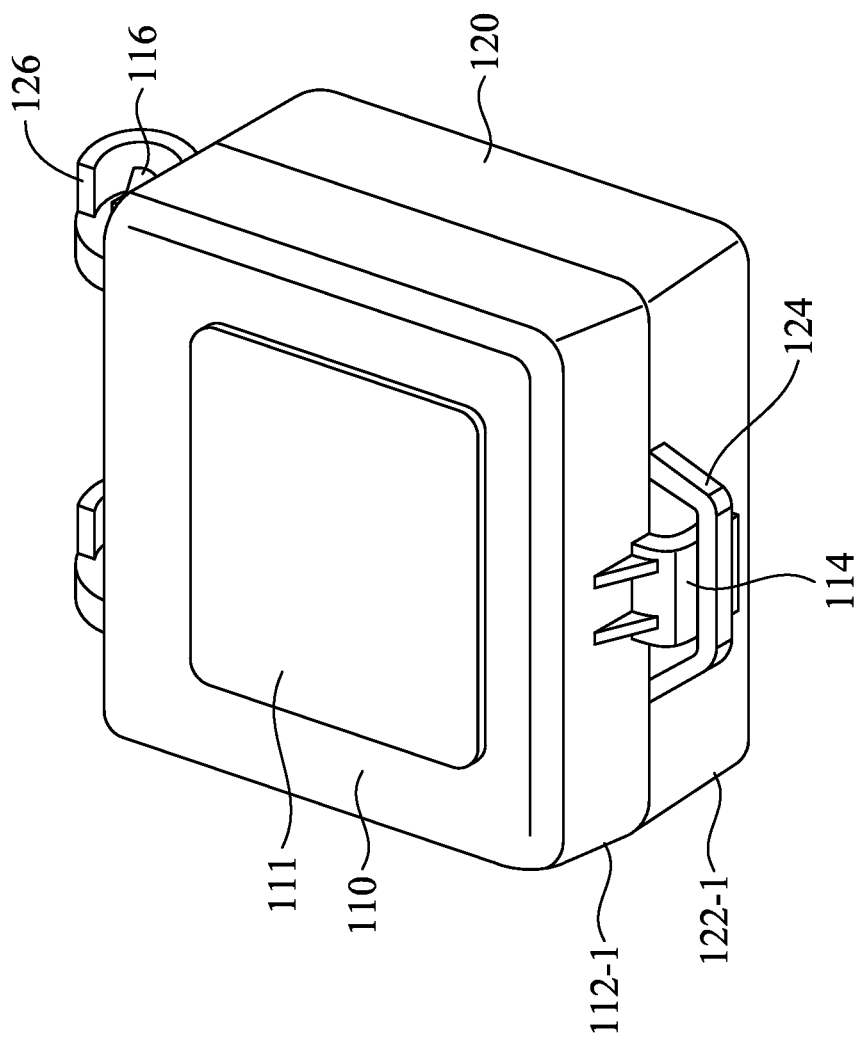
FIG. 1B illustrates a prospective view of the exemplary apparatus of FIG. 1A.
Figure 1C:
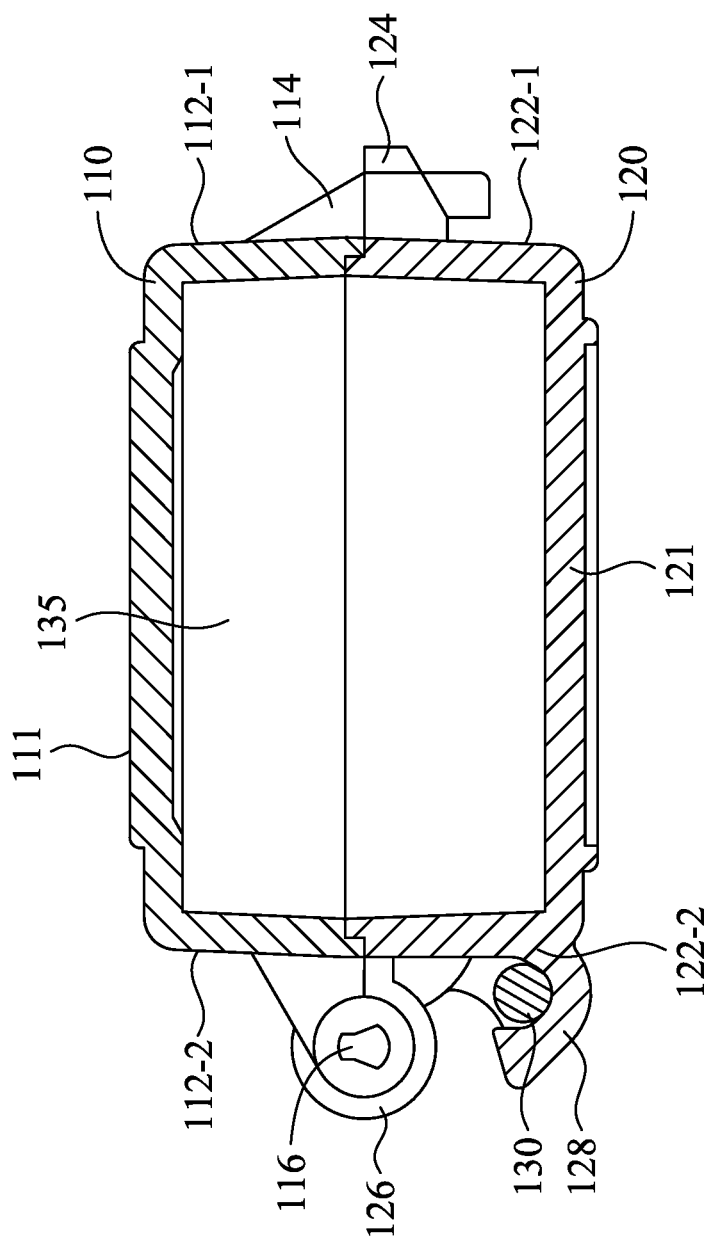
FIG. 1C illustrates a cross-sectional view of the exemplary apparatus of FIG. 1A.
Figure 1D:
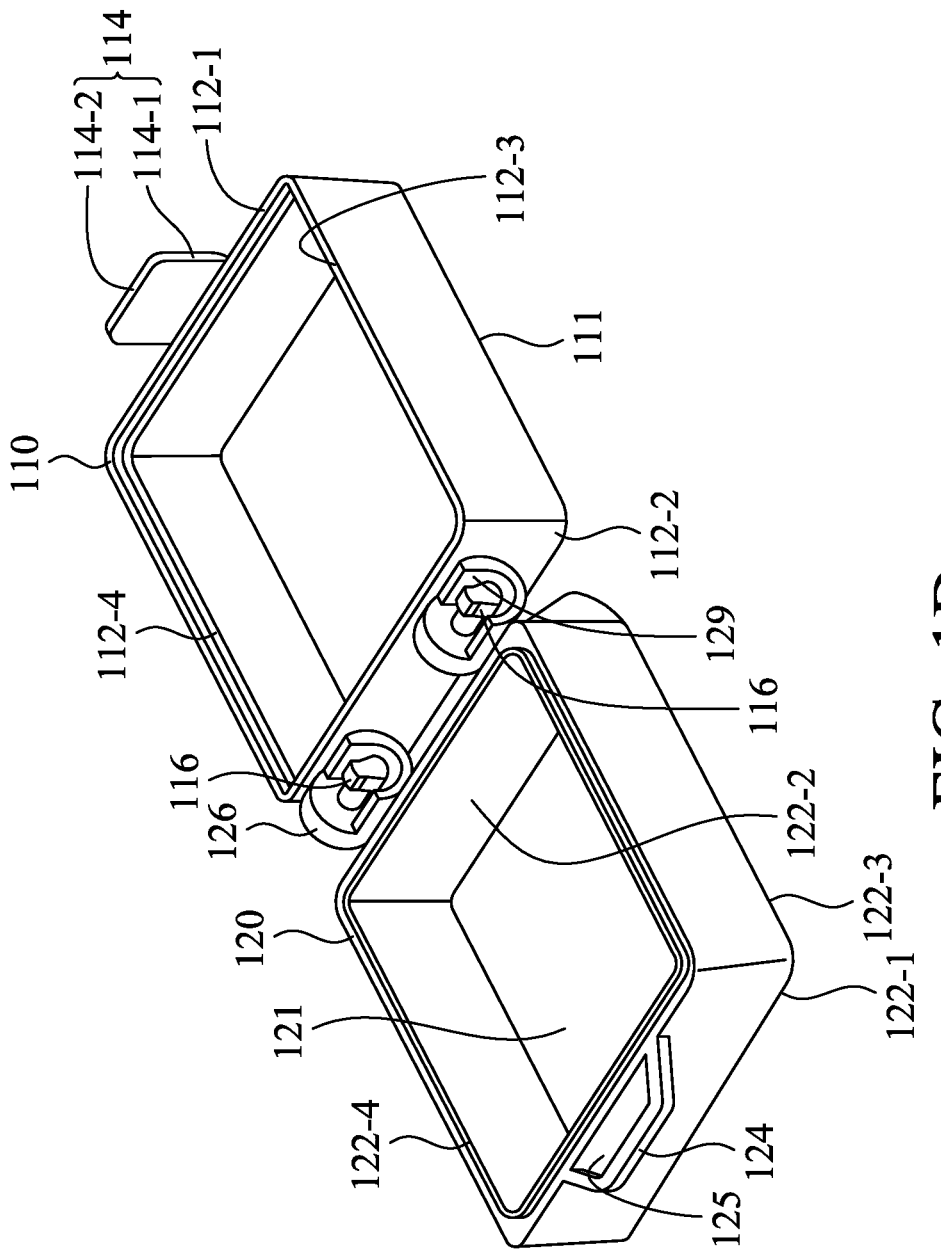
FIG. 1D is a prospective view illustrating the exemplary apparatus of FIG. 1A in an open configuration.
Figure 1E:
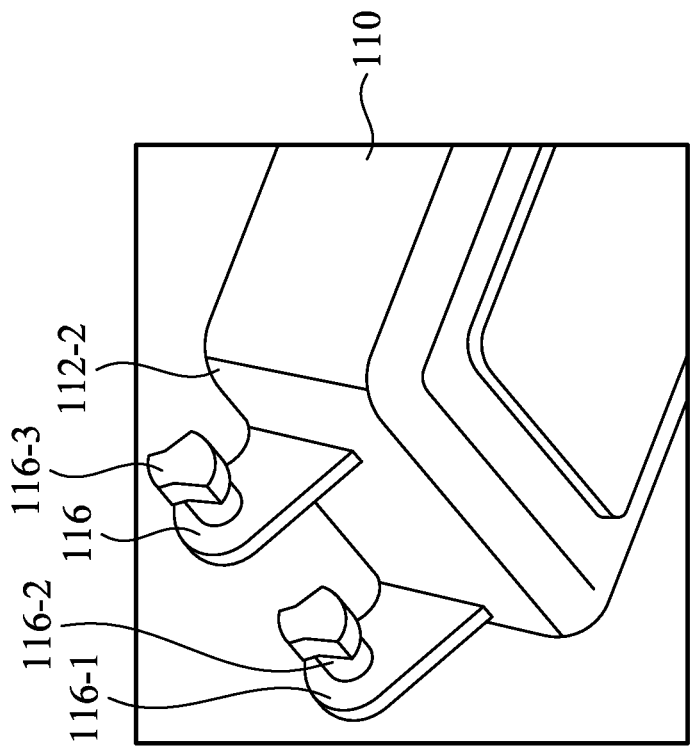
FIG. 1E is a partial view of an exemplary first portion of the exemplary apparatus of FIG. 1A in accordance with some embodiments.

The first portion 110 also comprises at least one pivotal pin structure 116 integrally coupled with and extending from the first rear side wall 112-2. In some embodiments, the at least one pivotal pin structure 116 comprises a base support 116-1 connected with the first rear side wall 112-2, a shaft 116-2 connected with the base support 116-1, and a head 116-3 connected with the shaft 116-2 and having a non-circular cross-sectional shape (FIGS. 1D-1E). In some embodiments, the first portion 110 is the top portion or the cover of the exemplary apparatus 100. In some embodiments, first portion 110 is a unitary molded piece.

Figure 1F:
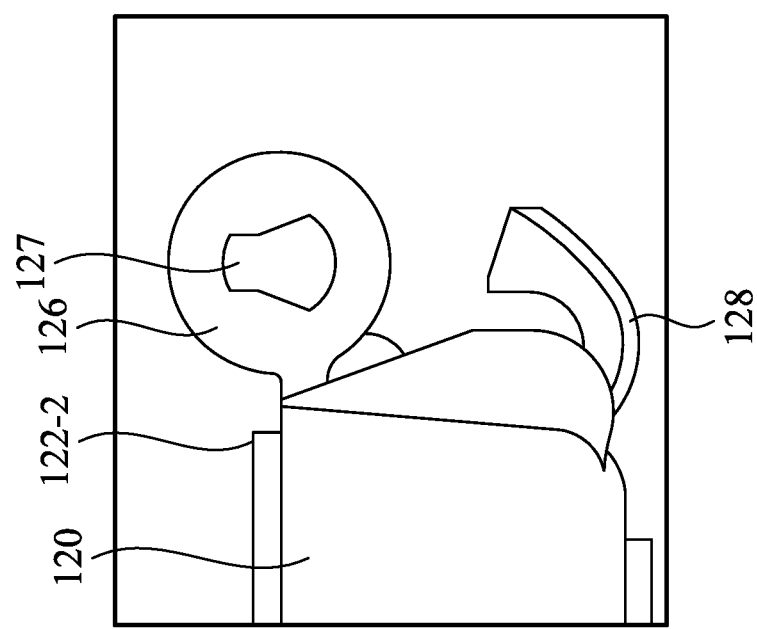
FIG. 1F is a partial view of an exemplary second portion of the exemplary apparatus of FIG. 1A in accordance with some embodiments.

The second portion 120 comprises a bottom wall 121, a second front side wall 122-1, a second rear side wall 122-2, and two additional side wall 122-3 and 122-4 integrally connected with the second front side wall 122-1 and the second rear side wall 122-2. The bottom wall 121 is integrally coupled with the second front side wall 122-1, the second rear side wall 122-2, and the other two additional side wall 122-3 and 122-4 (FIGS. 1D and 1F). In some embodiments, the second portion 120 is the bottom portion of the exemplary apparatus 100. In some embodiments, the second portion 120 is a unitary molded piece.

The second portion 120 also comprises at least one pin holder 126 integrally coupled with and extending from the second rear side wall 122-2. The at least one pin holder 126 defines an opening 127 sized and shaped to accept the head 116-3 of the at least one pivotal pin structure 116 at an alignment between the first portion 110 and the second portion 120. The head 116-3 of the at least one pivotal pin structure 116 extends through the opening 127 so as to connect the first portion 110 and the second portion 120. The first portion 110 and the second portion 120 are sized and shaped to be rotatably and pivotally movable between a closed container configuration (FIGS. 1A, 1B and 1C) an open configuration (FIG. 1D).

In some embodiments, the first portion 110 further comprises a latch 114 having a projection 114-1 and integrally connected with the first front side wall 112-1 (FIG. 1D). The second portion 120 further comprises a catch structure 124 defining a recess 125 (FIG. 1D). The catch structure 124 integrally connects with the second front wall 122-1. The projection 114-1 of the latch 114 has at least a portion releasably secured inside the recess 125 in the closed container configuration (FIG. 1B). In some embodiments, the projection 114-1 of the latch 114 has an end 114-2, which is configured to be pushed toward to the surface of the second front wall 122-1. The projection 114-1 of the latch 114 is released out from the recess 125. The first portion 110 can be moved away from the second portion 120 so as to form an open configuration (FIG. 1D).

Each wall of the first portion 110 and the second portion 120 may be in a square or rectangular shape as illustrated in the drawings of the present disclosure. However, these drawings are for illustration only. Each wall of the first portion 110 and the second portion 120 may be in any other suitable shape. Two additional side walls 112-3, 112-4, 121-3, and 121-4 may be optional in some embodiments. For example, the front walls 112-1 and 121-2, and the rear walls 112-2 and 112-4 may be curved and directly connected together in some embodiments. When each wall of the first portion 110 and the second portion 120 is in a square, rectangular or curved shape, each corner of the exemplary apparatus 100 may have a smooth curvature in some embodiments.

Referring to FIGS. 1E and 1F, in some embodiments, the opening 127 in the at least one pin holder 126 has a non-circular cross-sectional shape matching with and having substantially the same size as or slightly larger size than the non-circular cross-sectional shape of the head 116-3 of the at least one pivotal pin structure 116. The head 116-3 of the at least one pivotal pin structure 116 and the opening 127 of the at least one pin holder 126 are sized and shaped to allow the head 116-3 to pass through the opening 127 when the first portion 110 and the second portion 120 are tilted at a pre-determined (or a fixed) angle. The non-circular cross-sectional shape may be in any suitable shape with straight or curved lines. Such a shape may have a top portion narrower or wider than the bottom portion, and may have a certain angle on the side portion. Such a shape may lock the first portion 110 and the second portion 120 during the use of the exemplary apparatus 100. The first portion 110 and the second portion 120 cannot be separated unless they are tilted at the fixed angle and the head 116-3 is pulled out using a force.

In some embodiments, the second portion 120 may further define a slot 129, which is optional. The slot 129 may be half-open from the top. The shaft 116-2 or the head 116-3 of the at least one pivotal pin structure 116 is rotatably disposed inside the slot 129. The shaft 116-2 may have a cylindrical or any other suitable shape so as to be rotatable.

In some embodiments, the exemplary apparatus 100 further comprises a storage medium for wireless communication 130 (FIGS. 1A and 1C), for example, a radio-frequency identification (RFID) device. The storage medium for wireless communication 130 may include aerial signal processor and quick response (QR) code for storing information such as identification of samples inside the exemplar apparatus 100, quantity, weight and history record. RFID uses electromagnetic fields to automatically identify and track tags or devices attached to the exemplary apparatus 100. Such RFID devices contain electronically stored information. Passive tags or devices collect energy from a nearby RFID reader's interrogating radio waves. Active tags have a local power source such as a battery and may operate at hundreds of meters from the RFID reader. A receiver such as a computer may be used to record and track the information transmitted from the storage medium for wireless communication 130. In some embodiments, a reading device may be used to read out the information in storage medium for wireless communication 130. For example, a reading device such as GDE equipment is available from Gudeng Equipment Co., Ltd in Taiwan.

Referring to FIG. 1F, in some embodiments, the second portion 120 further comprises a bumper 128 integrally coupled with and extending from the second rear side wall 122-2, and disposed below the at least one pin holder 126. The storage medium for wireless communication 130 is disposed in a space between the bumper 128 and the second rear side wall 122-2 in some embodiments (FIG. 1C). The storage medium for wireless communication 130 may have an elongated shape such as a cylindrical or rod-like shape. The entrance between the bumper 128 and the second rear side wall 122-2 may have a size smaller than the diameter of the storage medium for wireless communication 130. A force is needed to push the storage medium for wireless communication 130 into such a space, and the storage medium for wireless communication 130 is secured between the bumper 128 and the second rear side wall 122-2.

In addition, in some embodiments, the bumper 128 of the second portion 120 is configured to contact the first portion 110 so as to provide the pre-determined angle. The bumper 128 may have a suitable size and shape with a top end so that the first portion 110 touches the bumper 128 to form the pre-determined angle needed to extend the head 116-3 into the opening 127 or push the head 116-3 out of the opening 127.

Figure 2A:
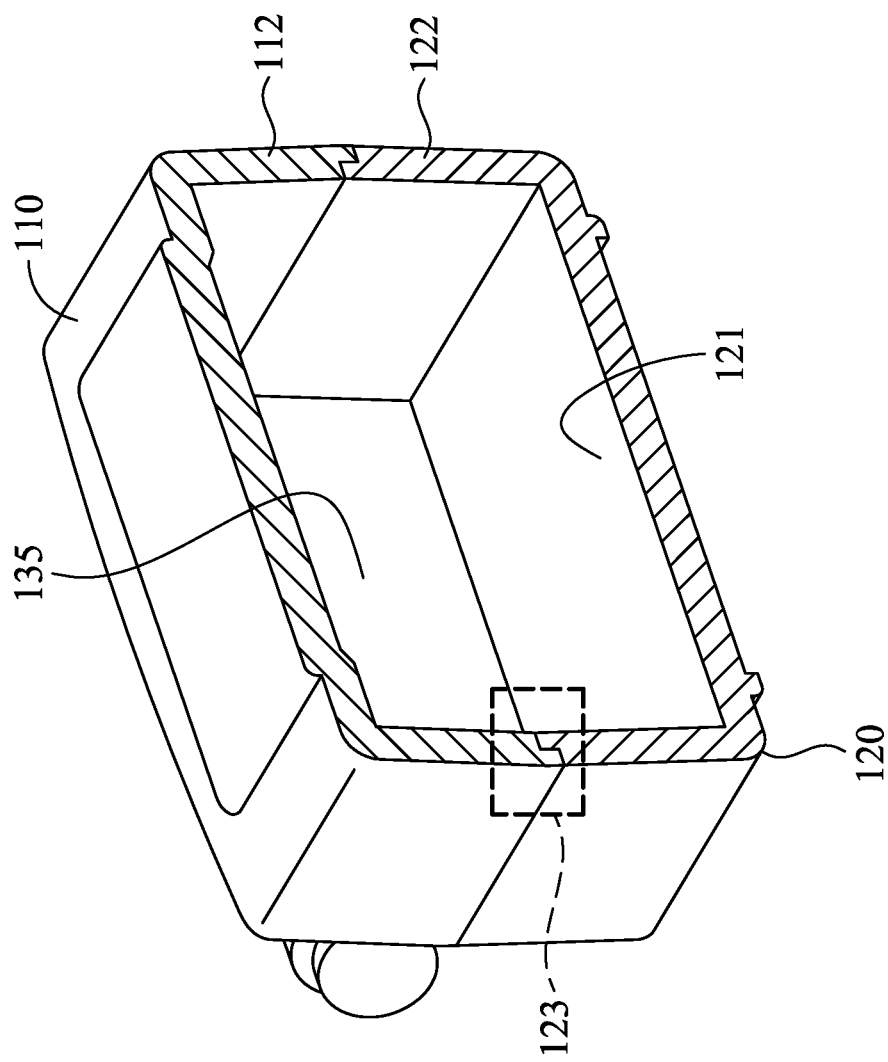
FIG. 2A is a partial and prospective view illustrating a vertical cross-section of the walls in the exemplary apparatus of FIG. 1A in accordance with some embodiments.
Figure 2B:
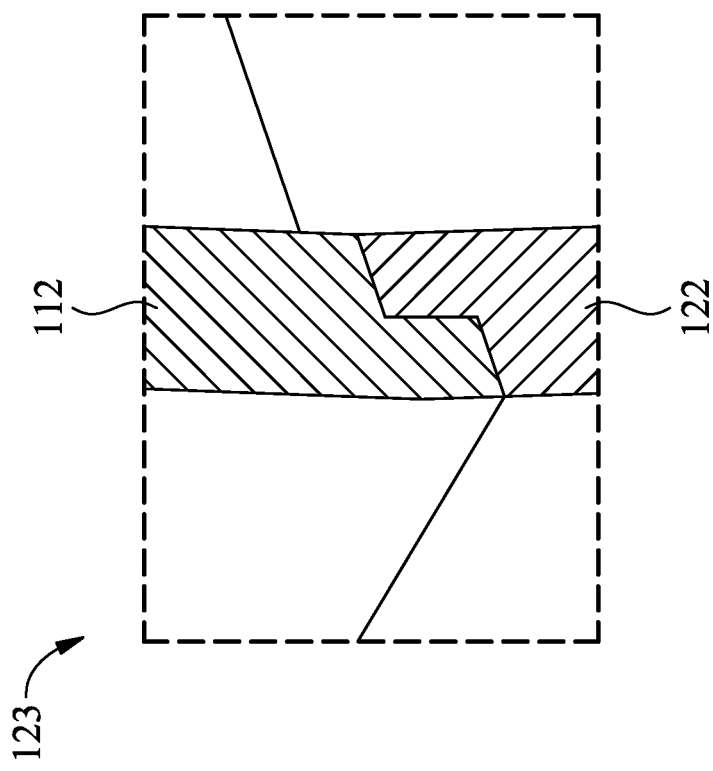
FIG. 2B is an enlarged detail of FIG. 2A illustrating an interlocking structure between the first portion and the second portion in accordance with some embodiments.

Referring to FIGS. 2A-2B, in some embodiments, the first portion 110 and the second portion 120 have matching edges in the side walls 112 and 122 to form an interlocking structure 123 (FIG. 2B) in the closed container configuration. Any suitable configuration may be used to form such an interlocking structure. For example, each of the side walls 112 and 122 may contain a male or female configuration, respectively, on the edges so as to form a male/female interlocking structure 123 when the first portion 110 and the second portion 120 are in a closed container configuration. For another example, each of the side walls 112 and 122 may contain a matching step-wise configuration on the edges. As shown in FIGS. 2A-2B, the side walls 112 in the first portion may have a downward step or flange on the exterior surface of the exemplary apparatus 100. The side walls 122 may have an upward step on the interior surface of the exemplary apparatus 100. When the first portion 110 is closed down onto the second portion 120, the side walls 112 and 122 form a matched interlocking structure 123. Any interlocking structure 123 provides excellent sealing for the exemplar apparatus 100 to prevent from external dust and moisture. In some embodiments the exemplary apparatus 100 in the closed container configuration are sealed airtight in some embodiments.

Each of the first portion 110 and the second portion 120 including the component therein may be one unitary molded piece in some embodiments. The first portion 110 and the second portion 120 can be molded from a same or different material, which may be plastic, plastoelastomer, elastomer, composite, or any other polymer containing material. The material may comprise a suitable polymer, including but not limited to, polycarbonate, polyester (e.g., PET), polyolefin, or any combination thereof. The material may comprise a conductive filler such as metals or a conductive polymer to provide anti-static properties. The material has a smooth surface, and also has high strength, toughness, and impact resistance. The resulting apparatus does not break upon a mechanical shock. Such a material may be translucent, transparent or opaque. In some embodiments, a UV resistant translucent material is used. The material is also resistant to chemicals such as acids, bases, and organic solvents, and can be washed after use. The material also withstands a temperature up to a limit, for example, 100° C., 120° C., or 150° C. In some embodiments, the material has a continuous temperature rating up to 120° C.

The exemplary apparatus 100 may be in any suitable size, for example, 16 mm×42 mm×42 mm, 19 mm×64 mm×64 mm, 20 mm×110 mm×90 mm, or 20 mm×165 mm×165 mm (height×length×width).

Referring to FIG. 2A, in some embodiments, the first portion 110 and the second portion 120 form an enclosure 135 in a closed container configuration. The exemplary apparatus 100 further comprises at least one, for example, two or more shelves (not shown) above the bottom wall 121 of the second portion 120 configured to store and secure semiconductor elements. The shelves are disposed vertically or horizontally in the enclosure 135. The semiconductor elements are disposed inside the apparatus 100 when the first and second portions 110 and 120 are in a closed configuration. The apparatus 100 is used for storing and transporting semiconductor elements, without any contamination from outside or any damage from chemicals, mechanical shock, heat or UV.

Figure 3:
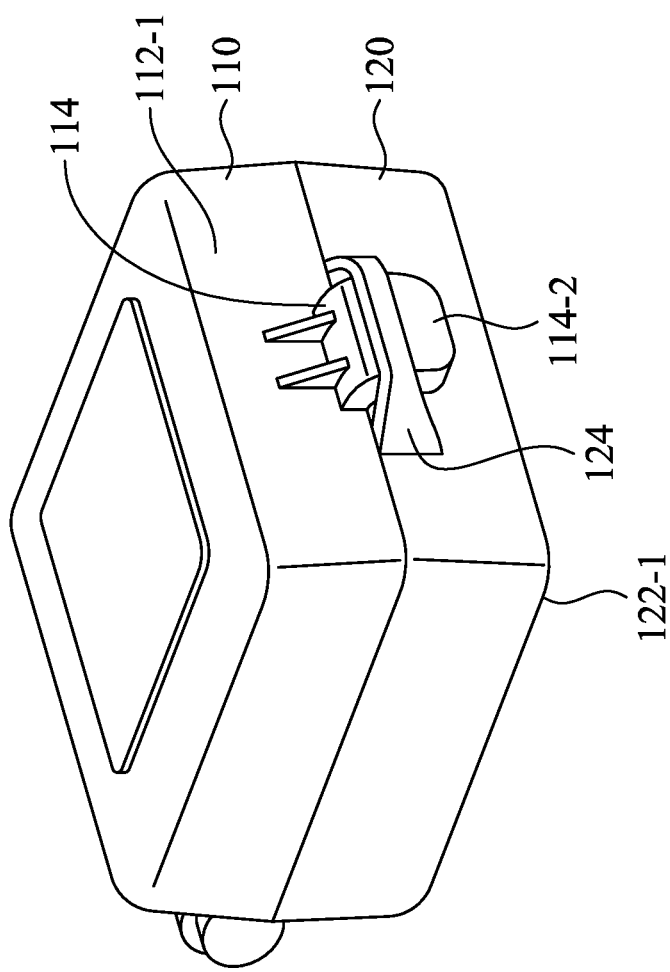
FIG. 3 is a prospective view illustrating an exemplary latch and an exemplary catch structure on the front side walls of the exemplary apparatus of FIG. 1A in a closed container configuration in accordance with some embodiments.

Referring to FIG. 3, another view of the exemplary apparatus 100 in the closed container configuration is illustrated, showing the latch 114 and the catch structure 124 on the front side walls 112-1 and 122-1. The latch 114 has at least a portion (e.g., a middle portion with thinner thickness) releasably secured inside the recess 125 defining by the catch structure 124 in the closed container configuration. In some embodiments, the latch 114 has an end 114-2, which is configured to be pushed toward to the surface of the second front wall 122-1. The end 114-2 may have a movable button. When the button is pushed inward, the end 114-2 may stay in and reduces the thickness, that allows the end 114-2 to pass through the recess 125. The latch 114 can be released out from the recess 125. The first portion 110 can be pivotally moved away from the second portion 120 to open the apparatus 100. When the button is pushed again, the button is moved outward to increase the thickness of the end 114-2. The button stays outward and locks the latch 114 and the catch structure 124.

Figure 4A:
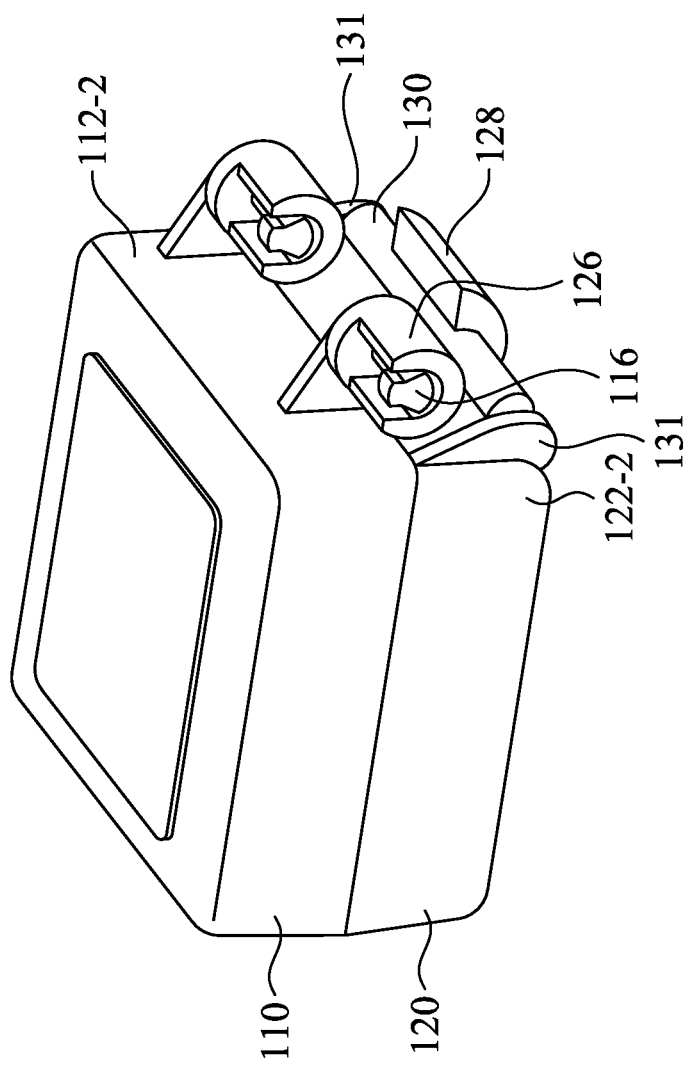
FIG. 4A is a prospective view illustrating the rear side walls of the exemplary apparatus of FIG. 1A in a closed container configuration in accordance with some embodiments.
Figure 4B:
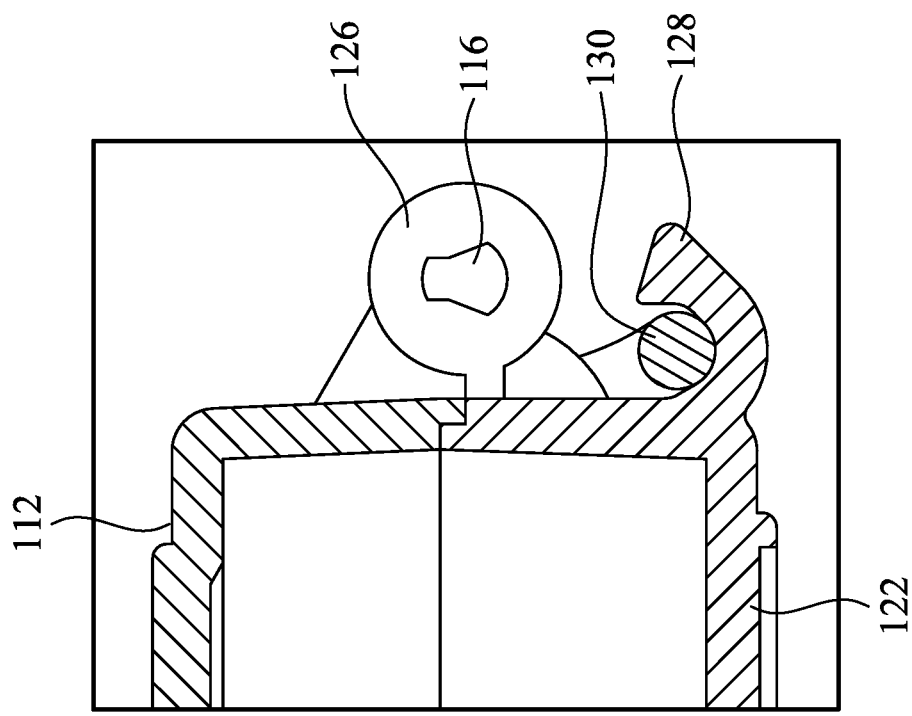
FIG. 4B is a partial and cross-sectional view illustrating the rear side walls of the exemplary apparatus of FIG. 4A in a closed container configuration.

Referring to FIGS. 4A and 4B, another view of the exemplary apparatus 100 in the closed container configuration is illustrated, showing the exemplary structures on the rear side walls 112-2 and 122-2 in some embodiments. In some embodiments, the at least one pivotal pin structure 116 in the first portion 110 comprises two pivotal pin structures 116. The at least one pin holder 126 in the second portion comprises two pin holders 126. Each respect pivotal pin structure 116 is engaged with a respective pin holder 126.

The two pivotal pin structures may have a same dimension and are aligned at a same direction parallel to each other (see also FIG. 1E).

The exemplary apparatus 100 also comprises a bumper 128 extending from the second rear side wall 122-2, and a storage medium for wireless communication 130 (e.g., a RFID device). The storage medium for wireless communication 130 is disposed with a space between the bumper 128 and the second rear side wall 122-2 in some embodiments (FIG. 1C). The storage medium for wireless communication 130 may have an elongated shape such as a cylindrical or rod-like shape. Referring to FIG. 4B, the size of the entrance between the bumper 128 and the second rear side wall 122-2 or the dimension between the bumper 128 and the at least one pin holder 126 may be smaller than the diameter of the storage medium for wireless communication 130. A force is needed to push the storage medium for wireless communication 130 into such a space, and the storage medium for wireless communication 130 is secured between the bumper 128 and the second rear side wall 122-2. Additionally, the second rear wall may provide two blocking pieces 131 to accommodate the length of the storage medium for wireless communication 130 to prevent the dislocation of the storage medium for wireless communication 130.

Referring to FIG. 5, an exemplary method 500 for forming an exemplary apparatus 100 is illustrated. At step 502, a first portion 110 as described herein is provided. The first portion 110 comprises a first front side wall 112-1, a first rear side wall 112-2, additional side walls 112-3 and 112-4, a top wall 111 integrally coupled with side walls, and at least one pivotal pin structure 116 integrally coupled with and extending from the first rear side wall 112-2. The at least one pivotal pin structure 116 comprises a base support 116-1 connected with the first rear side wall 112-2, a shaft 116-2 connected with the base support 116-1, and a head 116-3 connected with the shaft 116-2 and having a non-circular cross-sectional shape.

At step 504, a second portion 120 as described herein is provided. The second portion 120 comprises a second front side wall 122-1, a second rear side wall 122-2, additional side walls 112-3 and 112-4, a bottom wall 121 integrally coupled with side walls, and at least one pin holder 126 integrally coupled with and extending from the second rear side wall 122-2. The at least one pin holder defines an opening sized and shaped to accept the head of the at least one pivotal pin structure at an alignment.

Figure 6:
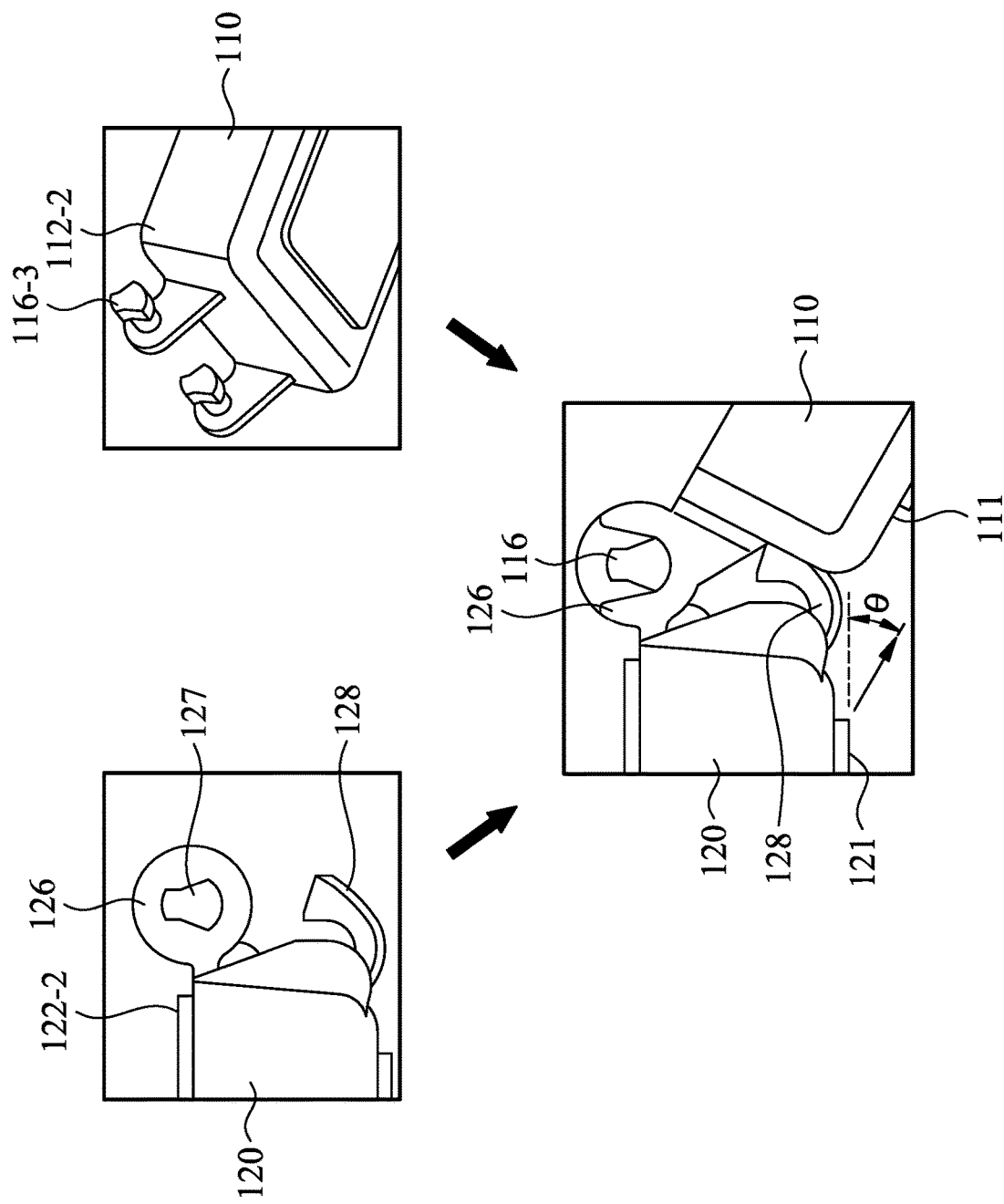
FIG. 6 illustrates that the head of at least one pivotal pin structure extends through the opening of the at least one pin holder when the first portion and the second portion are tilted at a pre-determined angle in accordance with some embodiments.

At step 506, the first portion and the second portion are tilted relative to each other at a pre-determined angle. Referring to FIG. 6, in some embodiments, the second portion 120 further comprises a bumper 128 integrally coupled with and extending from the second rear side wall 122-2. The bumper 128 is shaped and sized to contacts the first portion 110 so as to provide the pre-determined angle so that the head 116-3 of the at least one pivotal pin structure 116 can be pushed through the opening 127 for installation of the apparatus. The bumper 128 has an exterior surface contacting the surface of the first rear side wall 112-2. A top portion of the bumper 128 contacts a bottom point of the at least one pin holder 126, and contacts the surface of the first rear side wall 112-2. At this position, the top wall 111 of the first portion 110 and the bottom wall 121 of the second portion 120 form the pre-determined angle (labelled as θ in FIG. 6). At this position, in some embodiments, the non-circular cross-sectional shape of a head 116-3 of the at least one pivotal pin structure 116, and the non-circular cross-sectional shape of the opening 127 are oriented at a same direction. In addition, the first portion 110 and the second portion 120 need to be in this position for pulling out the head 116-3 from the opening 127 to dissemble the apparatus 100.

Figure 7A:
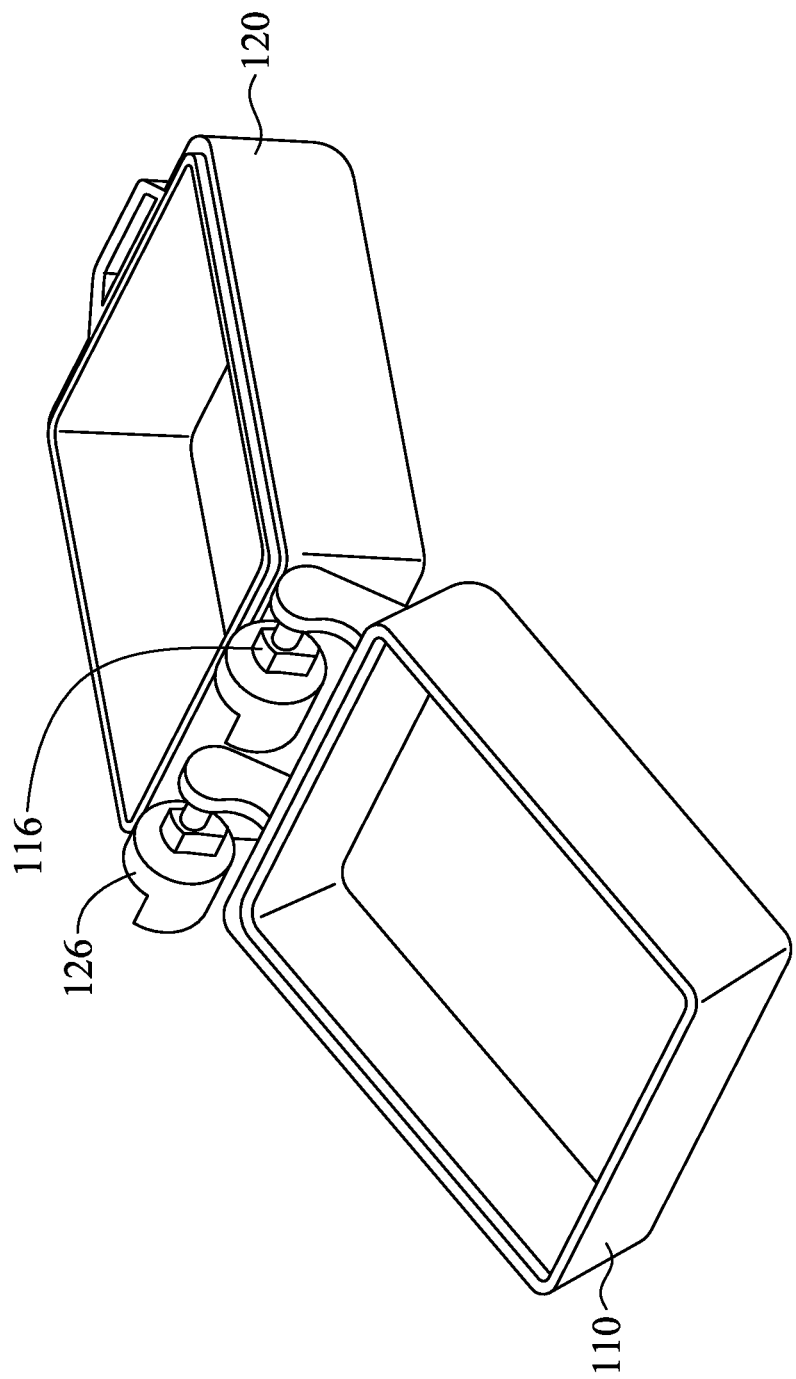
FIGS. 7A-7B illustrate the apparatus being installed in accordance with some embodiments.
Figure 7B:
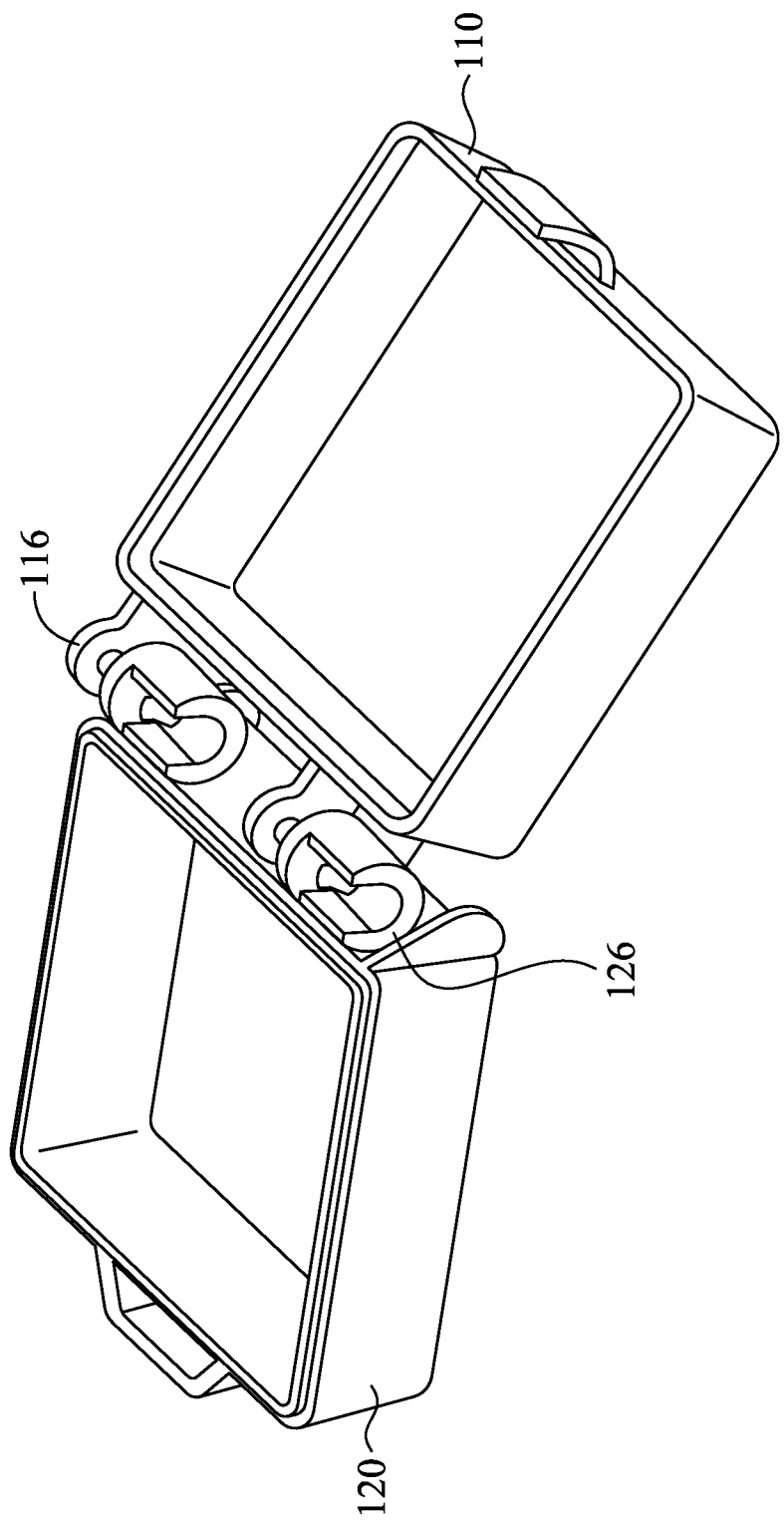

Referring to FIGS. 7A and 7B, in some embodiments, when the first portion 110 comprises two pivotal pin structures 116, and the second portion comprises two pin holders 126, each respect pivotal pin structure 116 is slidably mounted to and engaged with a respective pin holder 126. The two pivotal pin structures 116 and the two pin holders 126 are aligned in one same axis and at a same direction parallel to each other.

Figure 7C:
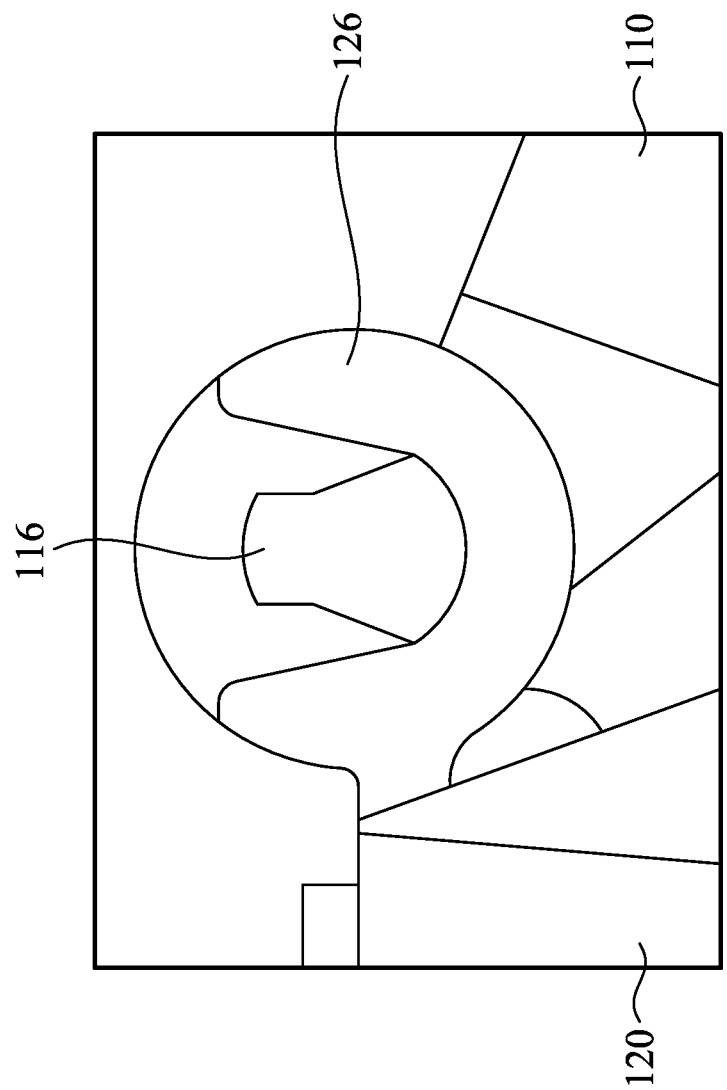
FIG. 7C is a partial view illustrating an exemplary apparatus, in which the head of at least one pivotal pin structure extends through the opening of the at least one pin holder of an exemplary apparatus in accordance with some embodiments.

At step 508, referring to FIGS. 7A-7B, the head 116-3 of the at least one pivotal pin structure 116 is extended through the opening 127. The resulting structure is illustrated in FIG. 7C. Step 506 may be performed by a pushing force. The first portion 110 and the second portion 120 are pivotally movable between an open configuration and a closed container configuration.

At step 510, a storage medium for wireless communication 130 is installed between the bumper 128 and the second rear side wall 122-2.

The apparatus 100 can be also reversibly dissembled. The method for dissembling the apparatus 100 comprises steps of opening the apparatus 100 by pushing the end of the end of the latch 114, tilting the first portion 110 and the second portion 120 at the pre-determined angle, and pulling the head 116-3 of the at least one pivotal pin structure 116 out of the opening 127 so as to separate the first portion 110 and the second portion 120.

The present disclosure provides an apparatus, and a method of making the same. The apparatus is used for storing and transporting semiconductor elements.

In accordance with some embodiments, such an apparatus comprises two body portions including a first portion (or a first body portion) and a second portion (or a second body portion). The first portion comprises a first front side wall, a first rear side wall, and a top wall integrally coupled with the first front side wall and the first rear side wall. The first portion also comprises at least one pivotal pin structure integrally coupled with and extending from the first rear side wall. The at least one pivotal pin structure comprises a base support connected with the first rear side wall, a shaft connected with the base support, and a head connected with the shaft and having a non-circular cross-sectional shape.

The second portion comprises a second front side wall, a second rear side wall, and a bottom wall integrally coupled with the second front side wall and the second rear side wall. The second portion also comprises at least one pin holder integrally coupled with and extending from the second rear side wall. The at least one pin holder defines an opening sized and shaped to accept the head of the at least one pivotal pin structure at an alignment. The head of the at least one pivotal pin structure extends through the opening. The first portion and the second portion are sized and shaped to be pivotally movable between an open configuration and a closed container configuration.

In some embodiments, the first portion further comprises a latch having a projection and integrally connected with the first front side wall. The second portion further comprises a catch structure defining a recess. The catch structure integrally connects with the second front wall. The projection of the latch has at least a portion releasably secured inside the recess in the closed container configuration. In some embodiments, the projection of the latch has an end, which is configured to pushed and release the projection out from the recess to move the first portion away from the second portion so as to form an open configuration.

In some embodiments, the first portion and the second portion have matching edges in the side walls to form an interlocking structure in the closed container configuration. The apparatus in the closed container configuration are sealed airtight in some embodiments.

In some embodiments, the opening in the at least one pin holder has a non-circular cross-sectional shape matching with and having substantially the same size as or slightly larger size than the non-circular cross-sectional shape of the head of the at least one pivotal pin structure. The head of the at least one pivotal pin structure, and the opening of the at least one pin holder are sized and shaped to allow the head to pass through the opening when the first portion and the second portion are tilted at a pre-determined angle.

In some embodiments, the second portion further defines a slot. The shaft in the at least one pivotal pin structure is rotatably disposed inside the slot. The shaft may have a cylindrical or any other suitable shape so as to be rotatable.

In some embodiments, the at least one pivotal pin structure in the first portion comprises two pivotal pin structures. The at least one pin holder in the second portion comprises two pin holders. Each respect pivotal pin structure is engaged with a respective pin holder. The two pivotal pin structures may have a same dimension and are aligned at a same direction parallel to each other.

In some embodiments, the apparatus further comprises a storage medium for wireless communication, for example, a radio-frequency identification (RFID) device. In some embodiments, the second portion further comprises a bumper integrally coupled with and extending from the second rear side wall, and disposed below the at least one pin holder. The storage medium for wireless communication is disposed between the bumper and the second rear side wall in some embodiments.

In some embodiments, the apparatus further comprises at least one, for example, two or more shelves above the bottom wall configured to store and secure semiconductor elements. The semiconductor elements are disposed inside the apparatus when the first and second portions are in a closed configuration. The apparatus is used for storing and transporting semiconductor elements, without any contamination from outside.

In some embodiments, an apparatus for transporting semiconductor elements, comprises a first portion and a second portion. The first portion comprises a first front side wall, a first rear side wall, a top wall integrally coupled with the first front side wall and the first rear side wall, and at least one pivotal pin structure integrally coupled with and extending from the first rear side wall. The second portion comprises a second front side wall, a second rear side wall, a bottom wall integrally coupled with the second front side wall and the second rear side wall, and at least one pin holder and a bumper integrally coupled with and extending from the second rear side wall. The at least one pivotal pin structure comprises a base support connected with the first rear side wall, a shaft connected with the base support, and a head connected with the shaft and having a non-circular cross-sectional shape. The at least one pin holder defines an opening sized and shaped to accept the head of the at least one pivotal pin structure at an alignment between the first portion and the second portion. The head of the at least one pivotal pin structure extends through the opening. The first portion and the second portion are sized and shaped to be pivotally movable between an open configuration and a closed container configuration. Such an apparatus may further comprise a storage medium for wireless communication disposed between the bumper and the second rear side wall.

In some embodiments, the head of the at least one pivotal pin structure and the opening of the at least one pin holder are sized and shaped to allow the head to pass through the opening when the first portion and the second portion are tilted at a pre-determined angle. The bumper of the second portion is configured to contact the first portion so as to provide the pre-determined angle. In some embodiments, the second portion further defines a slot, and the shaft in the at least one pivotal pin structure has a cylindrical shape and is rotatably disposed inside the slot.

In another aspect, the present disclosure provides a method for forming an apparatus as described herein. Such a method comprises providing a first portion and provide a second portion. The first portion comprises a first front side wall, a first rear side wall, a top wall integrally coupled with the first front side wall and the first rear side wall, and at least one pivotal pin structure integrally coupled with and extending from the first rear side wall. The at least one pivotal pin structure comprises a base support connected with the first rear side wall, a shaft connected with the base support, and a head connected with the shaft and having a non-circular cross-sectional shape. The second portion comprises a second front side wall, a second rear side wall, a bottom wall integrally coupled with the second front side wall and the second rear side wall, and at least one pin holder integrally coupled with and extending from the second rear side wall. The at least one pin holder defines an opening sized and shaped to accept the head of the at least one pivotal pin structure at an alignment.

Such a method further comprises steps of tilting the first portion and the second portion at a pre-determined angle, and extending the head of the at least one pivotal pin structure through the opening so that the first portion and the second portion are pivotally movable between an open configuration and a closed container configuration. In some embodiments, the second portion further comprises a bumper integrally coupled with and extending from the second rear side wall. The bumper contacts the first portion so as to provide the pre-determined angle so that the head of the at least one pivotal pin structure can be pushed through the opening for installation of the apparatus, or be pulled out from the opening for dissembling the apparatus. In some embodiments, the method for making the apparatus comprises a step of installing a storage medium for wireless communication between the bumper and the second rear side wall. The apparatus can be also reversibly dissembled. The method for dissembling the apparatus comprises steps of tilting the first portion and the second portion at the pre-determined angle, and pulling the head of the at least one pivotal pin structure out of the opening so as to separate the first portion and the second portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an apparatus comprising:
   providing a first portion comprising a first rear side wall and at least one pivotal pin structure integrally coupled with and extending from the first rear side wall, wherein the at least one pivotal pin structure comprises a base support connected with the first rear side wall, a shaft connected with the base support, and a head connected with the shaft and having a non-circular cross-sectional shape; and
   providing a second portion comprising a second rear side wall and at least one pin holder integrally coupled with and extending from the second rear side wall, wherein the at least one pin holder defines an opening sized and shaped to accept the head of the at least one pivotal pin structure;
   tilting the first portion and the second portion at a pre-determined angle;
   extending the head of the at least one pivotal pin structure through the opening to form the apparatus; and
   installing a storage medium for wireless communication onto the apparatus,
   wherein the second portion further comprises a bumper integrally coupled with and extending from the second rear side wall, and the bumper contacts the first portion so as to provide the pre-determined angle, and wherein the storage medium for wireless communication is installed between the bumper and the second rear side wall.

2. The method of claim 1, wherein the first portion further comprises a latch having a projection and integrally connected with the first front side wall.

3. The method of claim 2, wherein the second portion further comprises a catch structure defining a recess.

4. The method of claim 3, wherein the storage medium for wireless communication is a radio-frequency identification (RFID) device.

5. The method of claim 3, further comprising releasably securing a portion of the projection of the latch into the recess in the closed container configuration.

6. The method of claim 1, wherein the first portion and the second portion have matching edges, and an interlocking structure is formed from the matching edges in the closed container configuration.

7. The method of claim 1, wherein the opening in the at least one pin holder has a non-circular cross-sectional shape matching with and having substantially the same size as the non-circular cross-sectional shape of the head of the at least one pivotal pin structure.

8. The method of claim 1, wherein the head of the at least one pivotal pin structure and the opening of the at least one pin holder are sized and shaped to allow the head to pass through the opening when the first portion and the second portion are tilted at a pre-determined angle.

9. The method of claim 1, wherein the second portion further defines a slot, and the shaft in the at least one pivotal pin structure is rotatably disposed inside the slot.

10. The apparatus of claim 1, wherein the at least one pivotal pin structure in the first portion comprises two pivotal pin structures, the at least one pin holder in the second portion comprises two pin holders, and each respect pivotal pin structure is engaged with a respective pin holder.

11. The method of claim 10, wherein the two pivotal pin structures have a same dimension and are aligned at a same direction parallel to each other.

12. A method for forming an apparatus for transporting semiconductor elements, comprising:
    providing a first portion comprising a first rear side wall and at least one pivotal pin structure integrally coupled with and extending from the first rear side wall, wherein the at least one pivotal pin structure comprises a base support connected with the first rear side wall, a shaft connected with the base support, and a head connected with the shaft; and
    providing a second portion comprising a second rear side wall and at least one pin holder and a bumper integrally coupled with and extending from the second rear side wall, wherein the at least one pin holder defines an opening sized and shaped to accept the head of the at least one pivotal pin structure;
    tilting the first portion and the second portion at a pre-determined angle; and
    installing a storage medium for wireless communication between the bumper and the second rear side wall.

13. The apparatus of claim 12, wherein an entrance between the bumper and the second rear side wall has a size smaller than a diameter of the storage medium for wireless communication.

14. The method of claim 12, wherein the head of the at least one pivotal pin structure and the opening of the at least one pin holder are sized and shaped to allow the head to pass through the opening when the first portion and the second portion are tilted at a pre-determined angle.

15. The method of claim 12, wherein the bumper of the second portion is configured to contact the first portion so as to provide the pre-determined angle.

16. The method of claim 12, wherein the second portion further defines a slot, and the shaft in the at least one pivotal pin structure has a cylindrical shape and is rotatably disposed inside the slot.

17. The method of claim 12, further comprising:
    installing two or more shelves above the bottom wall configured to store semiconductor elements.

18. A method for forming an apparatus, comprising:
    providing a first portion comprising a first rear side wall and at least one pivotal pin structure integrally coupled with and extending from the first rear side wall, wherein the at least one pivotal pin structure comprises a base support connected with the first rear side wall, a shaft connected with the base support, and a head connected with the shaft; and
    providing a second portion comprising a second rear side wall and at least one pin holder and a bumper integrally coupled with and extending from the second rear side wall, wherein the at least one pin holder defines an opening sized and shaped to accept the head of the at least one pivotal pin structure; and
    installing a storage medium for wireless communication between the bumper and the second rear side wall.

19. The method of claim 18, further comprising
    tilting the first portion and the second portion at a pre-determined angle; and
    extending the head of the at least one pivotal pin structure through the opening so that the first portion and the second portion are pivotally movable between an open configuration and a closed container configuration.

20. The method of claim 18, wherein an entrance between the bumper and the second rear side wall has a size smaller than a diameter of the storage medium for wireless communication.

* * * * *